United States Patent
Wang (10) Patent No.: US 8,273,601 B2
(45) Date of Patent: Sep. 25, 2012

(54) METHOD OF FABRICATING MULTI-CHIP PACKAGE STRUCTURE

(75) Inventor: Chien-Hao Wang, Hsinchu County (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 13/110,228

(22) Filed: May 18, 2011

(65) Prior Publication Data

US 2011/0217813 A1    Sep. 8, 2011

Related U.S. Application Data

(62) Division of application No. 12/140,075, filed on Jun. 16, 2008, now Pat. No. 7,968,992.

(30) Foreign Application Priority Data

Mar. 3, 2008 (TW) ................. 97107328 A (51) Int. Cl.
*H01L 21/44* (2006.01)

(52) U.S. Cl. ........ 438/108; 438/106; 438/109; 438/100; 438/113; 438/613; 257/E21.508

(58) Field of Classification Search .................. None
See application file for complete search history.

(56) References Cited

U.S. PATENT DOCUMENTS

6,656,827 B1 * 12/2003 Tsao et al. ............... 438/612
* cited by examiner

*Primary Examiner* — Kyoung Lee
(74) *Attorney, Agent, or Firm* — J.C. Patents (57) ABSTRACT

A method of fabricating a multi-chip package structure is provided. In the method, a number of cavities are formed on a predetermined cutting line of a first wafer by partly removing the first wafer and a first metal layer. Conductive walls of a first circuit layer are electrically connected to a cut cross-section of the first metal layer exposed by the cavities. In addition, conductive bumps of a second wafer or a chip are pressed into a cover layer and electrically connected to the first circuit layer. The first metal layer is then patterned to form a second circuit layer having a number of second pads. Next, the first wafer and the second wafer are cut along the predetermined cutting line to form a number of separated multi-chip package structures.

20 Claims, 11 Drawing Sheets

METHOD OF FABRICATING MULTI-CHIP PACKAGE STRUCTURE

CROSS-REFERENCE TO RELATED APPLICATION

This application is a divisional application of and claims the priority benefit of patent application Ser. No. 12/140,075, filed on Jun. 16, 2008, now allowed, which claims the priority benefit of Taiwan patent application serial no. 97107328, filed on Mar. 3, 2008. The entirety of each of the above-mentioned patent applications is hereby incorporated by reference herein and made a part of this specification.

BACKGROUND OF THE INVENTION

1. Field of the Invention

The present invention relates to a semiconductor package process. More particularly, the present invention relates to a method of fabricating a multi-chip package structure.

2. Description of Related Art

With an advancement of semiconductor technologies, high density integrated circuit (IC) packages such as ball grid array (BGA) packages, chip-scale packages (CSPs), flip chip (F/C) packages, and multi-chip module (MCM) packages have been correspondingly developed. On account of an application of bumps instead of wires for reducing the length of connection circuits between chips and carriers in the above-mentioned high density IC packages, a transmission speed of signals between the chips and the carriers is significantly improved.

Figure 1:
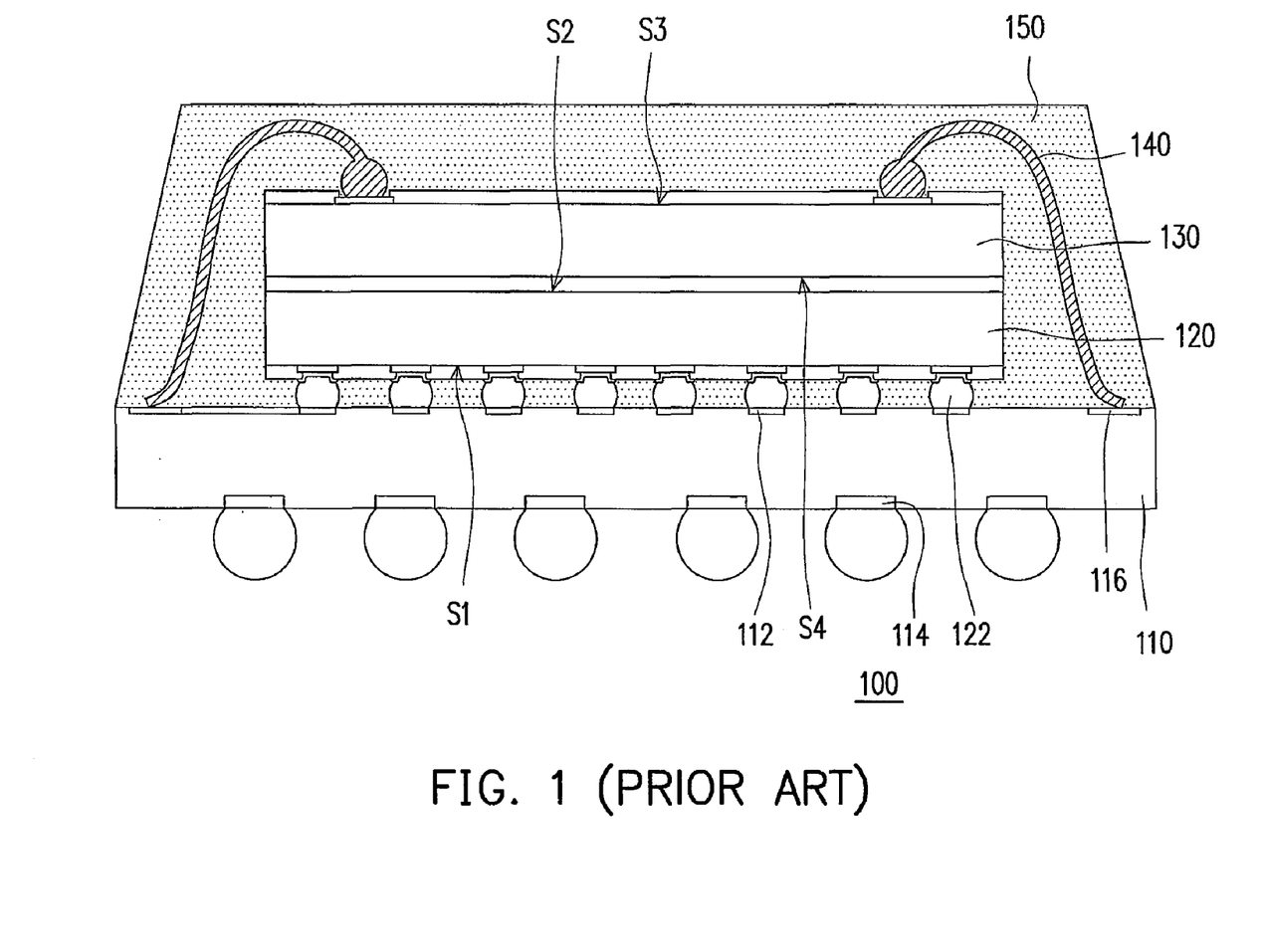
FIG. 1 is a schematic cross-sectional view showing a conventional multi-chip package structure.

FIG. 1 is a schematic cross-sectional view showing a conventional multi-chip package structure. Referring to FIG. 1, a multi-chip package structure 100 includes a carrier 110, a first chip 120, a second chip 130, a plurality of bonding wires 140, and a molding encapsulant 150. A plurality of pads 112, a plurality of pads 114, and a plurality of pads 116 are disposed on the carrier 110. The first chip 120 has an active surface S1 and a back surface S2. A plurality of bumps 122 is disposed on the active surface S1. The first chip 120 is electrically connected to the pads 112 via the bumps 122. In addition, the second chip 130 is disposed on the first chip 120 and has an active surface S3 and a back surface S4. The active surface S3 of the second chip 130 is electrically connected to the pads 116 of the carrier 110 via the plurality of bonding wires 140. The molding encapsulant 150 encapsulates the first chip 120, the second chip 130, and the bonding wires 140. In addition, the molding encapsulant 150 fills between the first chip 120 and the carrier 110.

However, the entire thickness and the dimension of the multi-chip package structure 100 are not apt to be reduced, thus diverging from the demands on miniaturization of the chip package structures and deteriorating the competitiveness of relevant products.

SUMMARY OF THE INVENTION

The present invention is directed to a method of fabricating a multi-chip package structure. In the method, a plurality of cavities is formed on a predetermined cutting line of a first wafer, so as to form conductive walls in the cavities.

The present invention is further directed to a method of fabricating a multi-chip package structure. In the method, conductive walls of a first circuit layer are electrically connected to a cut cross-section of a first metal layer exposed by a plurality of cavities.

The present invention is further directed to a method of fabricating a multi-chip package structure. In the method, an insulating layer covers a cut cross-section of a first wafer for enhancing insulating properties.

The present invention provides a method of fabricating a multi-chip package structure. The method includes first providing a first wafer having an active surface and a back surface opposite to the active surface. A plurality of bonding pads is disposed on the active surface. A first metal layer and a substrate are then adhered to the back surface of the first wafer. The first metal layer is interposed between the first wafer and the substrate. Besides, the first metal layer is adhered to the back surface of the first wafer through a glue layer, while the substrate is adhered to the first metal layer through an adhesive film. Next, a first insulating layer disposed on the active surface is patterned, such that a plurality of openings exposing the bonding pads is formed on the first insulating layer. Thereafter, a plurality of cavities is formed on a predetermined cutting line of the first wafer by partly removing the first insulating layer, the first wafer, and the first metal layer. An isolation layer is then formed on a cut cross-section of the first wafer in the cavities. After that, a first circuit layer having a plurality of first pads is formed on the first insulating layer, and conductive walls of the first circuit layer are electrically connected to a cut cross-section of the first metal layer exposed by the cavities. Thereafter, a cover layer is formed on the first circuit layer and in the cavities. A second wafer or a plurality of individual chips adhered to a carrier is then provided. Besides, a plurality of conductive bumps is formed on the second wafer. Afterwards, the conductive bumps of the second wafer are pressed into the cover layer and electrically connected to the first circuit layer. The substrate and the adhesive film are then removed to expose the first metal layer. Next, the second metal layer is patterned for forming a second circuit layer having a plurality of second pads. The first wafer and the second wafer are then cut along the predetermined cutting line to form a plurality of separated multi-chip package structures.

According to an embodiment of the present invention, the method of fabricating the multi-chip package structure further includes forming a solder mask layer on the second circuit layer and exposing the second pads before the step of cutting the first wafer and the second wafer is performed.

According to an embodiment of the present invention, the method of fabricating the multi-chip package structure further includes forming a passivation layer on the second pads after the formation of the solder mask layer.

According to an embodiment of the present invention, the method of fabricating the multi-chip package structure further includes forming a plurality of solder balls on the second pads after the formation of the passivation layer.

According to an embodiment of the present invention, the method of fabricating the multi-chip package structure further includes removing the carrier before or after the step of cutting the first wafer and the second wafer is performed.

The present invention further provides a multi-chip package structure. The multi-chip package structure includes a first chip, a second chip, a plurality of conductive bumps, a plurality of conductive walls, and a cover layer. The first chip has a first circuit layer and a second circuit layer. The first circuit layer is disposed on an active surface of the first chip, while the second circuit layer is disposed on a back surface of the first chip. The second chip is disposed on the first chip and has a third circuit layer disposed on an active surface of the second chip. The conductive bumps are electrically connected between the first circuit layer and the third circuit layer. The conductive walls are disposed at an edge of the first chip and electrically connected between the first circuit layer and the second circuit layer. The cover layer is interposed between the first chip and the second chip and covers the first circuit layer and the conductive walls.

According to an embodiment of the present invention, the first chip further has a first insulating layer patterned and disposed under the first circuit layer.

According to an embodiment of the present invention, the first chip further has a glue layer disposed under the second circuit layer.

According to an embodiment of the present invention, the second chip further has a second insulating layer patterned and disposed under the third circuit layer.

According to an embodiment of the present invention, the multi-chip package structure further includes an isolation layer interposed between the edge of the first chip and the conductive walls.

According to an embodiment of the present invention, the multi-chip package structure further includes a plurality of solder balls disposed on the back surface of the first chip and electrically connected to the second circuit layer.

According to the present invention, the first wafer and the second wafer are stacked in a face-to-face manner, and a wire bonding process is not required to be performed on the external carrier with use of the bonding wires. Thus, the entire thickness and the dimension of the multi-chip package structure are reduced. Meanwhile, signals are transmitted between the first chip and the second chip through the conductive walls instead of the circuits on the carrier and, therefore, the circuit layout of the carrier is simplified.

In order to make the aforementioned and other objects, features and advantages of the present invention more comprehensible, several embodiments accompanied with figures are described in detail below.

DESCRIPTION OF EMBODIMENTS

FIGS. 2A through 2G are schematic views illustrating a front-end stage of a method of fabricating a multi-chip package structure according to an embodiment of the present invention. Steps of the method of fabricating the multi-chip package structure in the front-end stage are mainly performed on a first wafer 200. Please refer to the embodiment illustrated in FIGS. 2A and 2B. First, the first wafer 200 is provided, on which the IC layout and the IC fabrication are completed. The first wafer 200 includes an active surface 202 and a back surface 204 opposite thereto. A plurality of bonding pads 206 is disposed on the active surface 202 and exposed by a passivation layer 208 covering the active surface 202. In a second step, a first metal layer 210 and a substrate 220 are adhered to the back surface 204 of the first wafer 200. The first metal layer 210 is interposed between the first wafer 200 and the substrate 220. The first metal layer 210 is adhered to the back surface 204 of the first wafer 200 through a glue layer 212. The substrate 220 is adhered to the first metal layer 210 through an adhesive film 222.

Figure 2A:
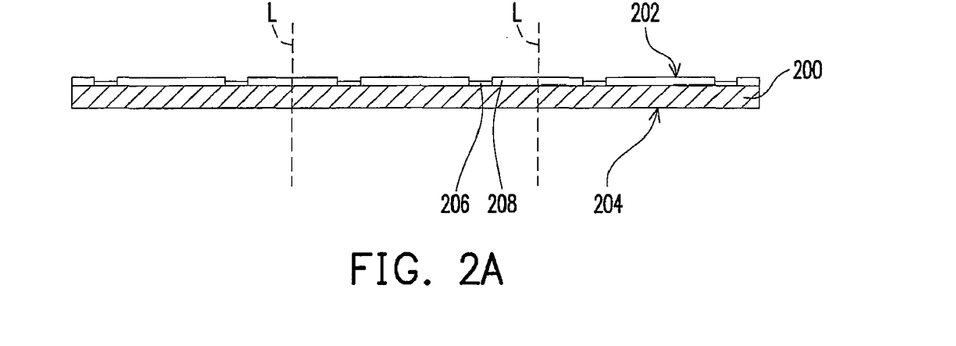
FIGS. 2A through 2G are schematic views illustrating a front-end stage of a method of fabricating a multi-chip package structure according to an embodiment of the present invention.
Figure 2B:
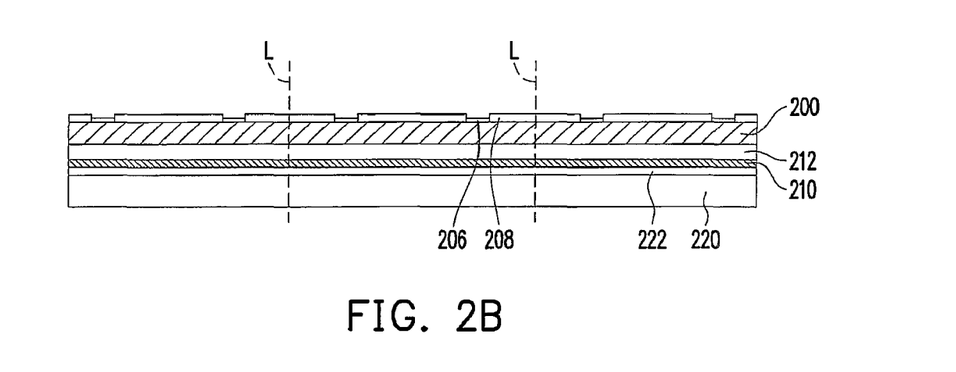

In the present embodiment, the first metal layer 210 is, for example, resin coated copper (RCC) formed by laminating an adhesive film and a copper foil. The substrate 220 is, for example, a glass substrate, a metal substrate, or a plastic substrate containing glass fiber materials. The adhesive film 222 is, for example, a release film which can be lifted due to a reduction of adhesion between the adhesive film 222 and the substrate 220. The reduced adhesion is arisen from heating or ultraviolet (UV) radiation. The first metal layer 210 is adhered to the back surface 204 of the first wafer 200 through the glue layer 212, while the substrate 220 is adhered to the first metal layer 210 through the adhesive film 222.

Figure 2C:
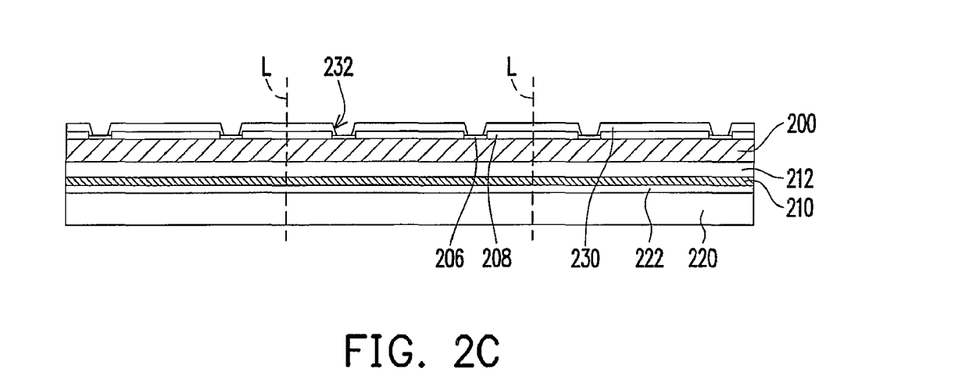
Figure 2D:
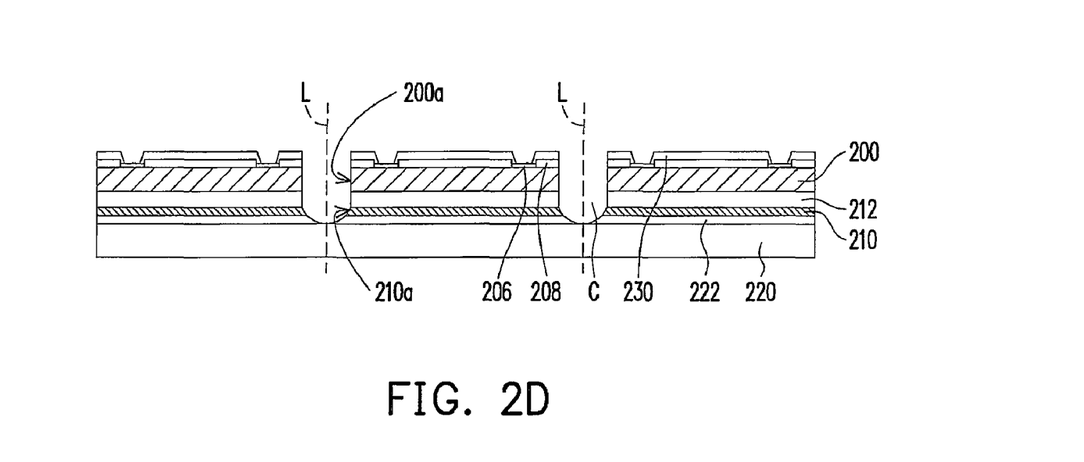

Next, referring to the embodiment depicted in FIGS. 2C and 2D, in a third step, a first insulating layer 230 disposed on the active surface 202 is patterned, such that a plurality of openings 232 exposing each of the bonding pads 206 is formed on the first insulating layer 230. After that, in a fourth step, a plurality of cavities C is formed on a predetermined cutting line L by partly removing the first insulating layer 230, the first wafer 200, and the first metal layer 210. The first insulating layer 230 is a polymer layer made of epoxy resin or polyimide, for example. In addition, the first insulating layer 230 is formed on the active surface 202 by, for example, a thermal compressing process, a spin coating process, a spray coating process, a roll coating process, and so on. Thereafter, a laser etching process or an exposure and development process is performed on the photosensitive insulating layer 230 to form the openings 232 with a predetermined dimension. Thereby, the underlying bonding pads 206 disposed below the first insulating layer 230 are exposed. Moreover, the cavities C are formed on the predetermined cutting line L of the first wafer 200 by means of plasma etching, laser etching, dicing blade, and so on. Since the cavities C extend downward and go deep into the adhesive film 222 from the first insulating layer 230, a cut cross-section 200a of the first wafer 200 and a cut cross-section 210a of the first metal layer 210 are exposed by each of the cavities C.

Figure 2E:
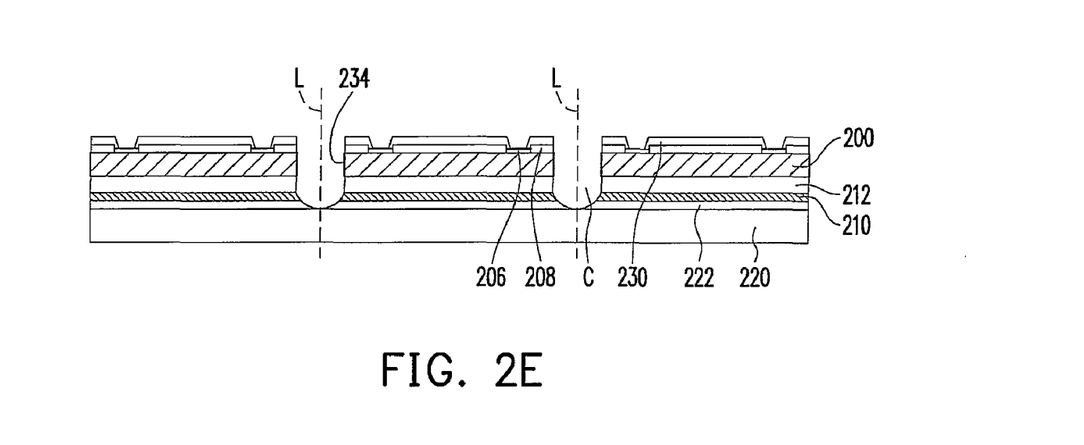
Figure 2F:
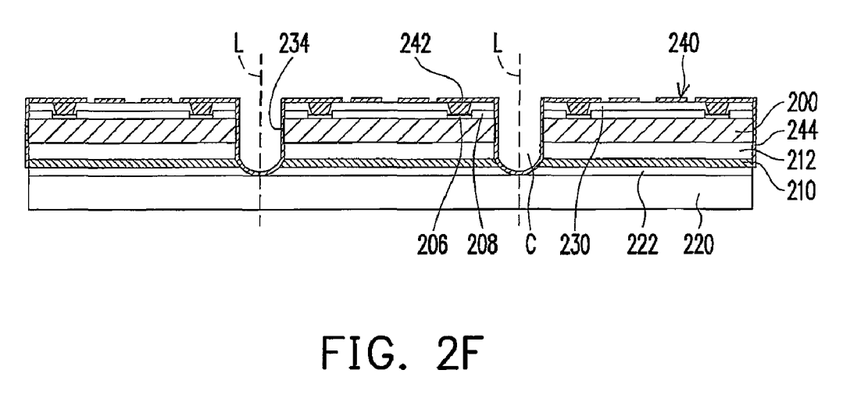
Figure 5:
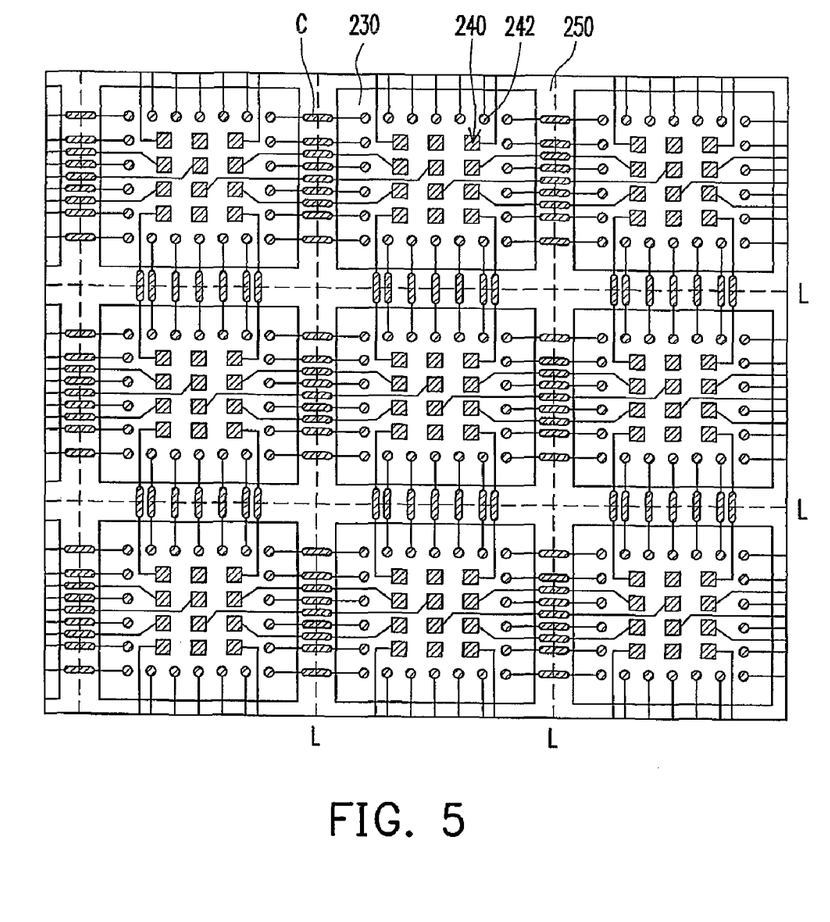
FIG. 5 is a schematic top view of FIG. 2F.

Afterwards, referring to the embodiment illustrated in FIGS. 2E and 2F, in a fifth step, an isolation layer 234 is formed on the cut cross-section 200a of the first wafer 200 in the cavities C. In a sixth step, a first circuit layer 240 having a plurality of first pads 242 is formed on the first insulating layer 230. The first circuit layer 240 is electrically connected to the cut cross-section 210a of the first metal layer 210 exposed by the cavities C. The isolation layer 234 is, for example, made of a deposited insulating material, such as silicon nitride, silicon dioxide, and so forth. In an alternative, the isolation layer 234 can be formed by implementing an electrophoretic deposition method. Besides, in the first circuit layer 240, required conductors are formed by implementing a sputtering process, an electroless plating process, a chemical vapor deposition process, or other physical vapor deposition processes. An electroplating process is then performed on the conductors to increase the thickness of the conductors and to etch the conductors, so as to form predetermined circuit patterns. The first circuit layer 240 is electrically connected to the bonding pads 206 of the first wafer 200 through the first pads 242 disposed on the first circuit layer 240. The first circuit layer 240 is further electrically connected to the cut cross-section 210a of the first metal layer 210 through conductive walls 244 of the first circuit layer 240. Note that the cut cross-section 210a of the first metal layer 210 is exposed by each of the cavities C. The arrangement of the first pads 242, the circuit layout of the first circuit layer 240, and the shape and the position of the cavities C are depicted in FIG. 5 which is a schematic top view.

Figure 2G:
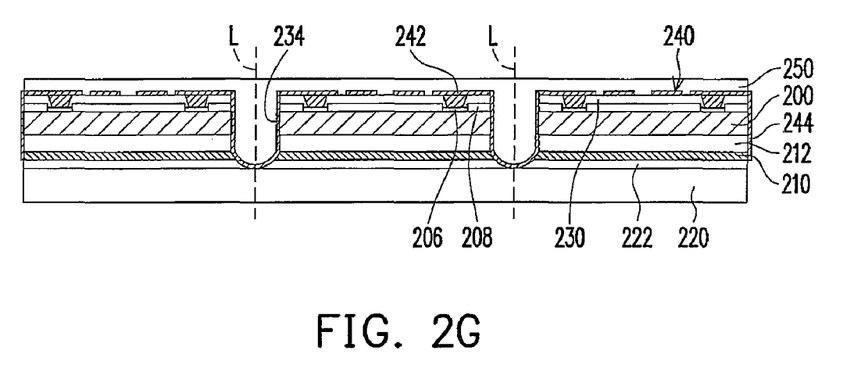
Figure 3A:
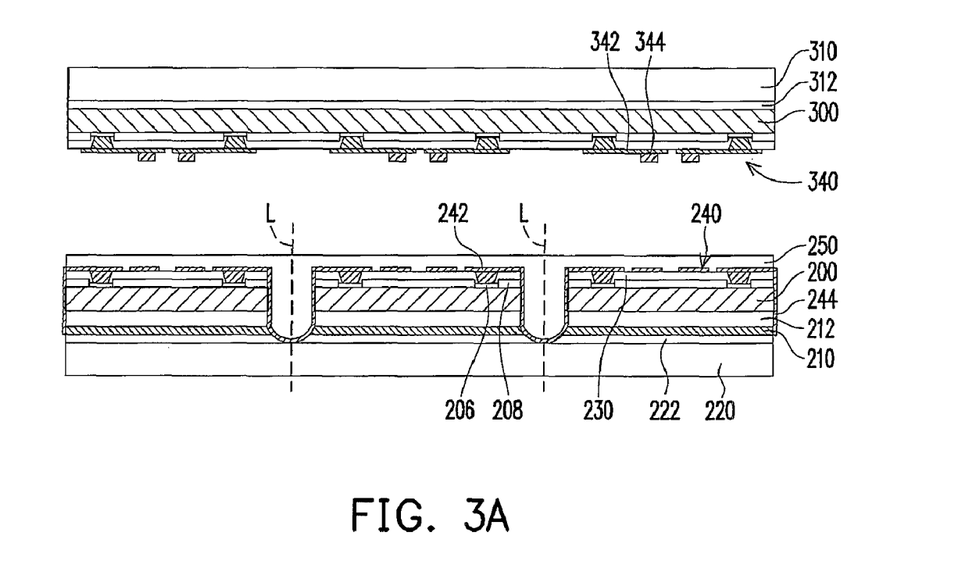
FIGS. 3A through 3G are schematic views illustrating a back-end stage of a method of fabricating a multi-chip package structure according to an embodiment of the present invention.
Figure 3B:
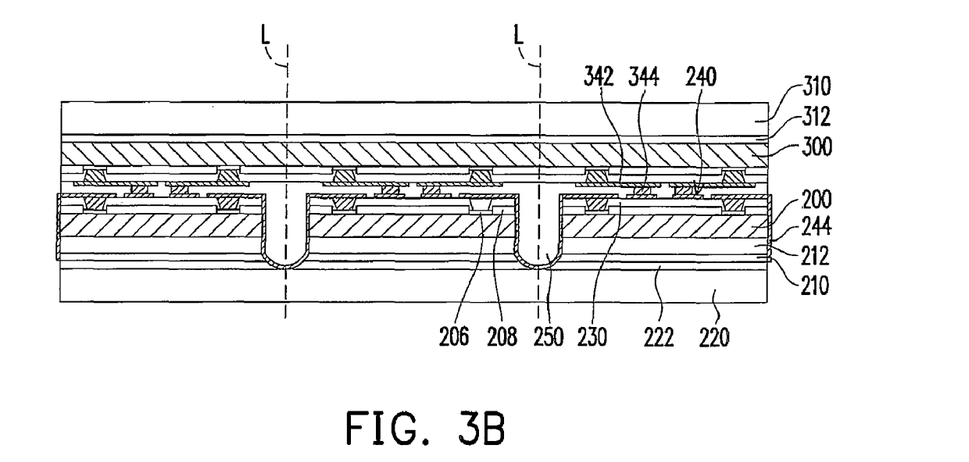

Next, referring to the embodiment depicted in FIG. 2G, in a seventh step, a cover layer 250 is formed on the first circuit layer 240 and in each of the cavities C. The cover layer 250 is, for example, an anisotropic conductive film (ACF) or a non-conductive adhesive which can be well bonded to the first circuit layer 240. Besides, the cover layer 250 can also be made of prepregs serving as a bonding adhesive between the first wafer 200 and a second wafer 300 (as indicated in FIG. 3A).

After the steps of fabricating the multi-chip package structure in the front-end stage is completely performed on the first wafer 200, the second wafer 300 is subsequently disposed on the first wafer 200 through a flip-chip (F/C) bonding technology, so as to complete the fabrication of the entire multi-chip package structure. Alternatively, instead of using a second wafer, a plurality of individual chips or dies is provided.

FIGS. 3A through 3G are schematic views illustrating a back-end stage of the method of fabricating the multi-chip package structure according to an embodiment of the present invention. Referring to the embodiment illustrated in FIGS. 3A and 3B, the second wafer 300 is provided at first. The second wafer 300 is adhered to a carrier 310 and has a plurality of conductive bumps 344, such as electroplated gold bumps, copper bumps, or bumps manufactured by performing a printing process. The method of fabricating the second wafer 300 will be described in detail later. Next, the conductive bumps 344 of the second wafer 300 are pressed into the cover layer 250 and are electrically connected to the first circuit layer 240. As the cover layer 250 is the ACF, the conductive bumps 344 can be electrically connected to the first circuit layer 240 through metallic particles in the ACF. By contrast, as the cover layer 250 is the non-conductive adhesive, the conductive bumps 344 penetrate the non-conductive adhesive and are directly electrically connected to the first circuit layer 240. The first wafer 200 and the second wafer 300 stacked together can then be solidified and shaped up after a thermal compression process is carried out to heat the cover layer 250 (made of the prepregs).

Figure 3C:
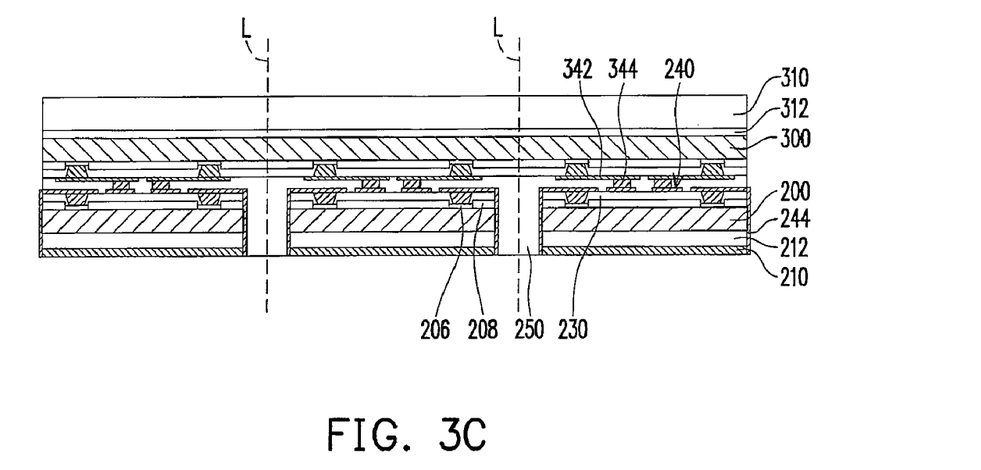
Figure 3D:
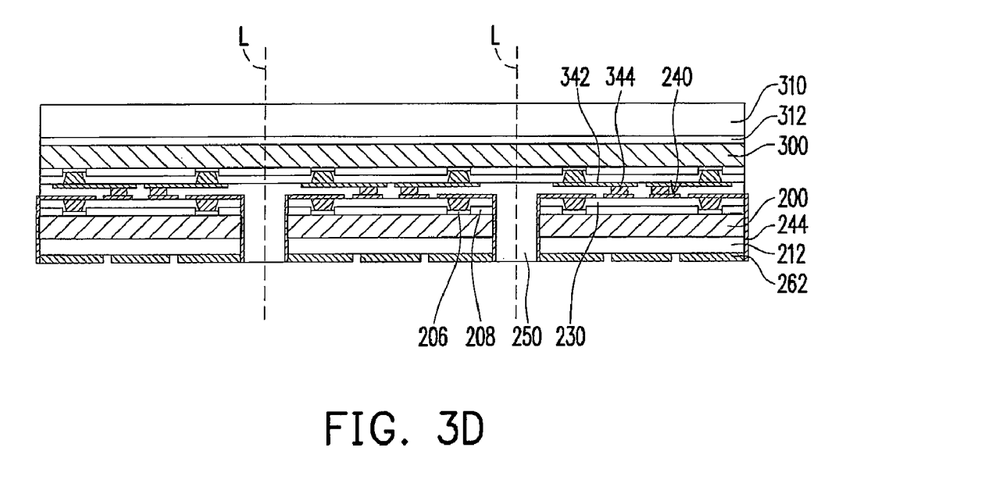

After that, referring to the embodiment depicted in FIGS. 3C and 3D, in a third step, the substrate 220 and the adhesive film 222 disposed under the first metal layer 210 are removed to expose the first metal layer 210. In a fourth step, the first metal layer 210 is patterned for forming a second circuit layer 260 having a plurality of second pads 262. The adhesive film 222 interposed between the substrate 220 and the first metal layer 210 can be easily lifted after heated or radiated by the UV light, and thus no residue of the adhesive film 222 remains on the first metal layer 210. In addition, the first metal layer 210 can form the second circuit layer 260 having the second pads 262 through the implementation of the patterning processes including the exposure and development process and the etching process. The second pads 262 can be electrically connected to the first pads 242 through each of the conductive walls 244, while the first circuit layer 240 can be electrically connected to the second wafer 300 through the conductive bumps 344, so as to achieve the electrical transmission.

Figure 3E:
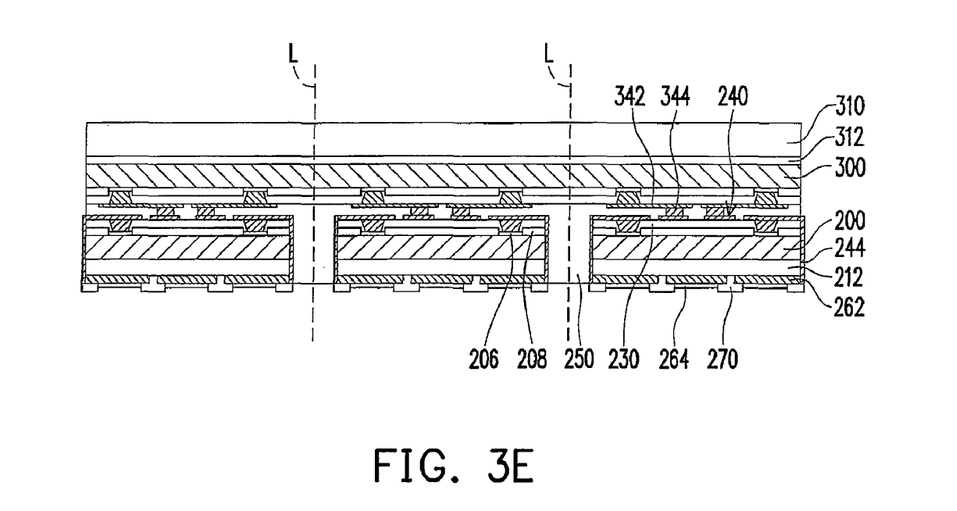
Figure 3F:
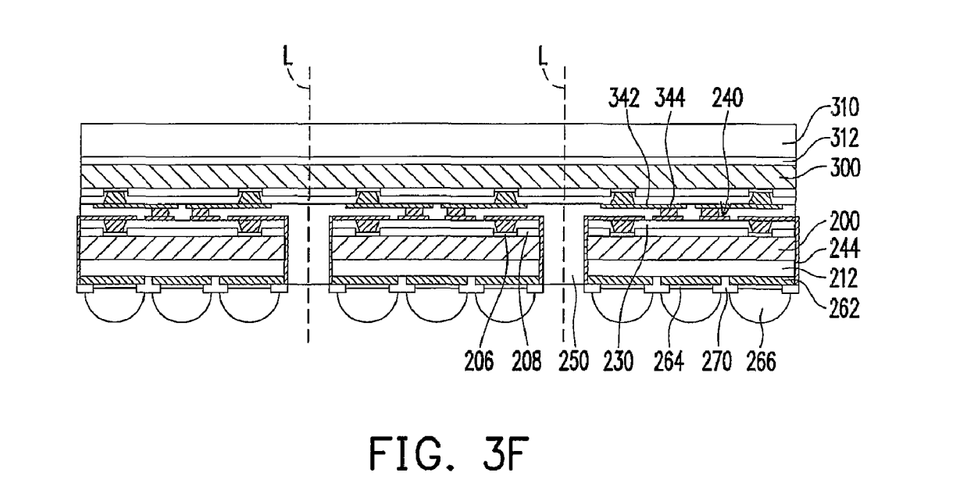
Figure 3G:
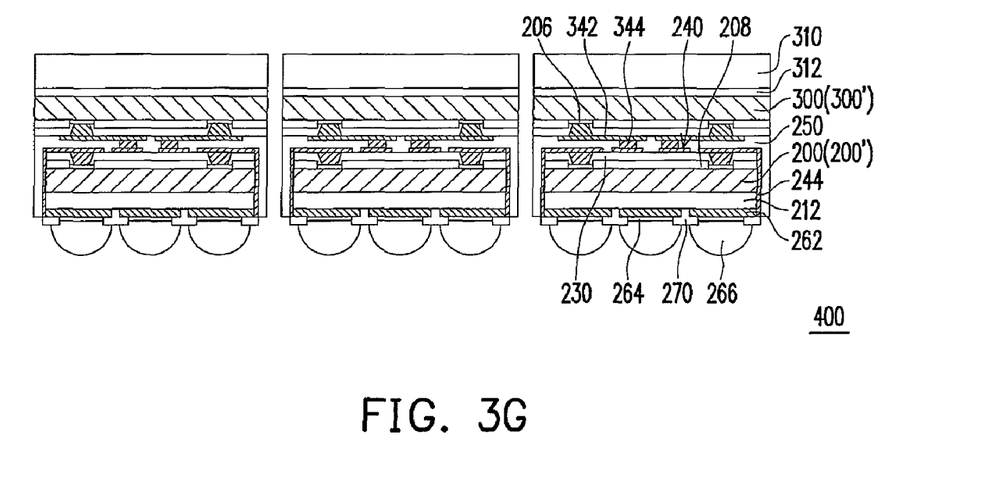
Figure 4A:
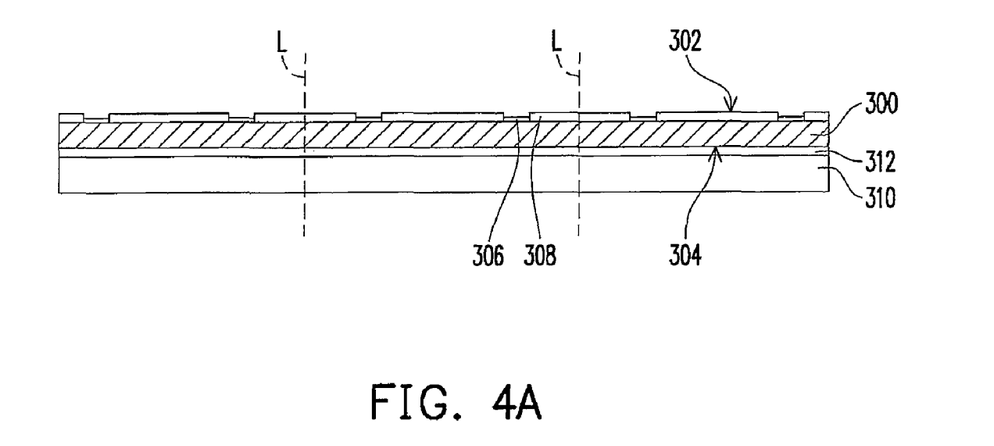
FIGS. 4A through 4D are schematic views illustrating a fabricating process of a second wafer according to an embodiment of the present invention.
Figure 4B:
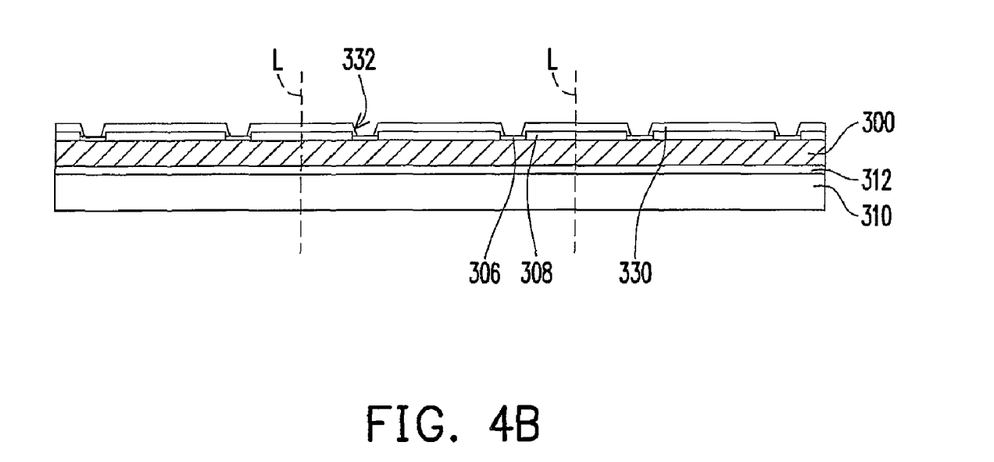
Figure 4C:
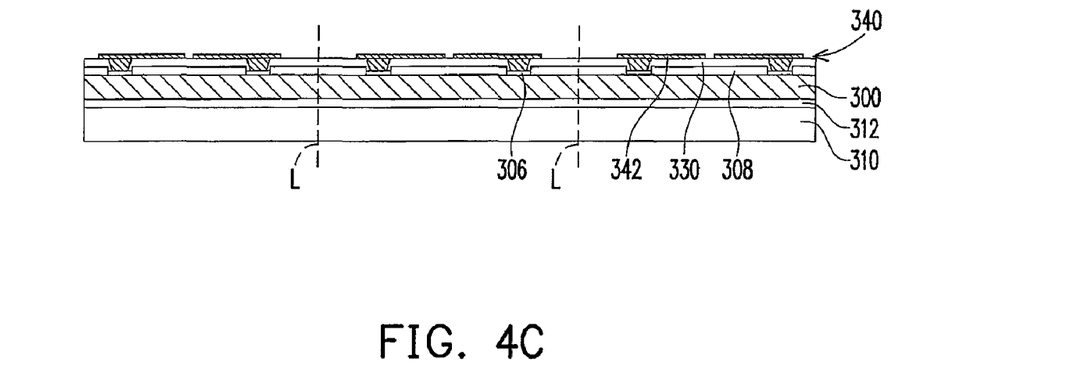
Figure 4D:
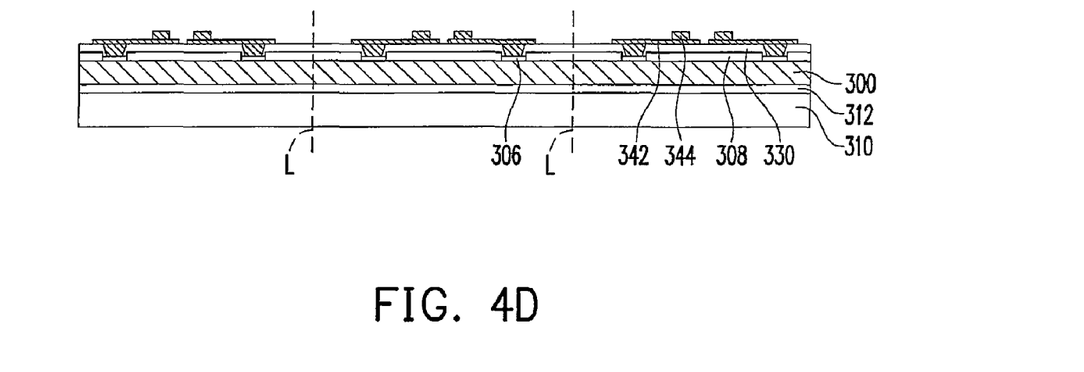

Finally, please refer to FIGS. 3E through 3G. In one embodiment, after the formation of the second circuit layer 260, the first wafer 200 and the second wafer 300 can be cut along the predetermined cutting line L, so as to form a plurality of separated multi-chip package structures. If a plurality of individual chips is provided, rather than the second wafer, only the first wafer 200 is cut during the cutting process. By contrast, in another embodiment, after the formation the second circuit layer 260, a solder mask layer 270 depicted in FIG. 3E is formed on the second circuit layer 260, while the second pads 262 are exposed. Next, a passivation layer 264 depicted in FIG. 3F is formed on the second pads 262. The passivation layer 264 is, for example, a nickel gold alloy layer or any other oxidation-resistant layer. Thereafter, a plurality of solder balls 266 depicted in FIG. 3F is formed on the second pads 262. Finally, the first wafer 200 and the second wafer 300 are cut along the predetermined cutting line L, and the carrier 310 and a paste 312 are removed, so as to form a plurality of separated multi-chip package structures 400 as illustrated in FIG. 3G. In the present embodiment, the carrier 310 can also be removed before the first wafer 200 and the second wafer 300 are cut.

The fabrication process performed on the second wafer 300 is described hereinafter with reference to FIGS. 4A through 4D. First, the second wafer 300 is adhered to the carrier 310. The second wafer 300 has an active surface 302 and a back surface 304 opposite to the active surface 302. A plurality of bonding pads 306 is disposed on the active surface 302 and exposed by a passivation layer 308 covering the active surface 302. The carrier 310 is adhered to the back surface 304 of the second wafer 300 through the paste 312, so as to improve the structural strength.

In a second step, a second insulating layer 330 disposed on the active surface 302 is patterned, such that a plurality of openings 332 exposing the bonding pads 306 is formed on the second insulating layer 330. Next, in a third step, a third circuit layer 340 having a plurality of third pads 342 is formed on the second insulating layer 330. Besides, the third circuit layer 340 is electrically connected to the bonding pads 306 through the third pads 342. In a fourth step, a plurality of conductive bumps 344 is formed on the third pads 342 by performing the electroplating process or the printing process. In the aforesaid steps, the method of forming the second insulating layer 330 and the material of the second insulating layer 330 are similar to the fabrication method and the material of the first insulating layer 230 on the first wafer 200, and thus no further description is provided herein. Moreover, the formation and the material of the third circuit layer 340 are similar to those of the first circuit layer 240 on the first wafer 200, and thus no further description is provided herein.

It is known from the above method that the multi-chip package structure which is cut as shown in FIG. 3G includes a first chip 200', a second chip 300', the plurality of conductive bumps 344, the plurality of conductive walls 244 disposed at an edge of the first chip 200', and the cover layer 250. The first chip 200' has the first circuit layer 240 and the second circuit layer 260. The first circuit layer 240 is disposed on an active surface of the first chip 200', while the second circuit layer 260 is disposed on a back surface of the first chip 200'. Additionally, the first circuit layer 240 and the second circuit layer 260 are electrically connected to each other through the conductive walls 244. The second chip 300' has the third circuit layer 340 disposed on its active surface, and the third circuit layer 340 is electrically connected to the first circuit layer 240 through the conductive bumps 344. The cover layer 250 is interposed between the first chip 200' and the second chip 300'. Besides, the cover layer 250 covers and protects the first circuit layer 240 and the conductive walls 244.

To sum up, the first wafer and the second wafer are stacked in a face-to-face manner according to the present invention, and the wire bonding process is not required to be performed on the external carrier with use of the bonding wires. Thus, the entire thickness and the dimension of the multi-chip package structure are reduced. Meanwhile, signals are transmitted between the first chip and the second chip through the conductive walls instead of the circuits on the carrier and, therefore, the circuit layout of the carrier is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a multi-chip package structure, comprising:
   providing a first wafer having an active surface and a back surface opposite to the active surface, a plurality of bonding pads being disposed on the active surface;
   patterning a first insulating layer disposed on the active surface, such that a plurality of openings exposing the bonding pads is formed on the first insulating layer;
   forming a plurality of cavities on a predetermined cutting line of the first wafer by partly removing the first insulating layer and the first wafer;
   forming a first circuit layer on the first insulating layer, wherein the first circuit layer has a plurality of first pads;
   providing a second wafer and forming a plurality of conductive bumps on the second wafer;
   electrically connecting the conductive bumps of the second wafer to the first circuit layer;
   forming a second circuit layer having a plurality of second pads on the back surface of the first wafer; and
   cutting the first wafer and the second wafer along the predetermined cutting line to form a plurality of separated multi-chip package structures.

2. The method of claim 1, further comprising forming an isolation layer on a cut cross-section of the first wafer in the cavities before the step of forming a first circuit layer on the first insulating layer is performed.

3. The method of claim 1, further comprising forming a cover layer on the first circuit layer and in the cavities after the step of forming a first circuit layer on the first insulating layer is performed.

4. The method of claim 3, the step of electrically connecting the conductive bumps of the second wafer to the first circuit layer comprising:
   pressing the conductive bumps of the second wafer into the cover layer, so that the conductive bumps are electrically connected to the first circuit layer.

5. The method of claim 1, wherein the step of providing a second wafer comprises adhering the second wafer on a carrier.

6. The method of claim 5, further comprising removing the carrier after the step of cutting the first wafer and the second wafer is performed.

7. The method of claim 1, wherein the step of forming the conductive bumps comprises:
   patterning a second insulating layer disposed on the second wafer;
   forming a third circuit layer on the second insulating layer, the third circuit layer having a plurality of third pads; and
   forming the conductive bumps on the third pads, respectively.

8. The method of claim 1, further comprising adhering a first metal layer on the back surface of the first wafer through a glue layer and adhering a substrate on the first metal layer through an adhesive film after the step of providing a first wafer is performed.

9. The method of claim 8, wherein the first circuit layer has a plurality of conductive walls electrically connected to a cut cross-section of the first metal layer.

10. The method of claim 8, wherein the step of forming a second circuit layer having a plurality of second pads on the back surface of the first wafer comprises:
    removing the substrate and the adhesive film to expose the first metal layer; and
    patterning the first metal layer for forming a second circuit layer having a plurality of second pads.

11. A method of fabricating a multi-chip package structure, comprising:
    providing a wafer having an active surface and a back surface opposite to the active surface, a plurality of bonding pads being disposed on the active surface;
    patterning a first insulating layer disposed on the active surface, such that a plurality of openings exposing the bonding pads is formed on the first insulating layer;
    forming a plurality of cavities on a predetermined cutting line of the wafer by partly removing the first insulating layer and the wafer;
    forming a first circuit layer on the first insulating layer, wherein the first circuit layer has a plurality of first pads;
    providing at least a chip and forming a plurality of conductive bumps on the chip;
    bonding the conductive bumps of the chip to the first circuit layer;
    forming a second circuit layer having a plurality of second pads on the back surface of the wafer; and
    cutting the wafer along the predetermined cutting line to form a plurality of separated multi-chip package structures.

12. The method of claim 11, further comprising forming an isolation layer on a cut cross-section of the wafer in the cavities before the step of forming a first circuit layer on the first insulating layer is performed.

13. The method of claim 11, further comprising forming a cover layer on the first circuit layer and in the cavities after the step of forming a first circuit layer on the first insulating layer is performed.

14. The method of claim 13, the step of electrically connecting the conductive bumps of the chip to the first circuit layer comprising:
    pressing the conductive bumps of the chip into the cover layer, so that the conductive bumps are electrically connected to the first circuit layer.

15. The method of claim 11, further comprising adhering the chip on a carrier after the step of bonding the conductive bumps of the chip to the first circuit layer is performed.

16. The method of claim 15, further comprising removing the carrier after the step of cutting the wafer is performed.

17. The method of claim 11, wherein the step of forming the conductive bumps comprises:
    patterning a second insulating layer disposed on the chip;
    forming a third circuit layer on the second insulating layer, the third circuit layer having a plurality of third pads; and
    forming the conductive bumps on the third pads, respectively.

18. The method of claim 11, further comprising adhering a first metal layer on the back surface of the wafer through a glue layer and adhering a substrate on the first metal layer through an adhesive film after the step of providing a wafer is performed.

19. The method of claim 18, wherein the first circuit layer has a plurality of conductive walls electrically connected to a cut cross-section of the first metal layer.

20. The method of claim 19, wherein the step of forming a second circuit layer having a plurality of second pads on the back surface of the wafer comprises:

removing the substrate and the adhesive film to expose the first metal layer; and patterning the first metal layer for forming a second circuit layer having a plurality of second pads.

* * * * *